United States Patent
Li et al.

(10) Patent No.: US 12,199,072 B2
(45) Date of Patent: Jan. 14, 2025

(54) ARRAY SUBSTRATE, METHOD OF MANUFACTURING THE SAME, AND DISPLAY DEVICE

(71) Applicants: BOE MLED Technology Co., Ltd., Beijing (CN); BOE TECHNOLOGY GROUP CO., LTD., Beijing (CN)

(72) Inventors: Jinpeng Li, Beijing (CN); Ming Zhai, Beijing (CN); Pei Li, Beijing (CN); Zhiyuan Wang, Beijing (CN); Pengjun Cao, Beijing (CN); Jian Li, Beijing (CN); Teng Zhang, Beijing (CN); Zijian Wang, Beijing (CN); Chiachiang Lin, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 923 days.

(21) Appl. No.: 17/254,807

(22) PCT Filed: Nov. 5, 2019

(86) PCT No.: PCT/CN2019/115591
§ 371 (c)(1),
(2) Date: Dec. 21, 2020

(87) PCT Pub. No.: WO2021/087726
PCT Pub. Date: May 14, 2021

(65) Prior Publication Data
US 2021/0366881 A1 Nov. 25, 2021

(51) Int. Cl.
*H01L 25/075* (2006.01)
*H01L 25/16* (2023.01)
(Continued)

(52) U.S. Cl.
CPC ........ *H01L 25/0753* (2013.01); *H01L 25/167* (2013.01); *H01L 33/58* (2013.01);
(Continued)

(58) Field of Classification Search
CPC ... H01L 25/0753; H01L 25/167; H01L 33/58; H01L 33/62; H01L 2933/0058; H01L 2933/0066; H01L 2933/0091
See application file for complete search history.

(56) References Cited

U.S. PATENT DOCUMENTS

| 10,453,827 B1 | 10/2019 | Hussell et al. |
| 2009/0127702 A1* | 5/2009 | Dekker ............... H01L 21/6835 257/E23.101 |

(Continued)

FOREIGN PATENT DOCUMENTS

| CN | 105430123 A | 3/2016 |
| CN | 207082529 U | 3/2018 |

(Continued)

OTHER PUBLICATIONS

ISA China National Intellectual Property Administration, International Search Report and Written Opinion Issued in Application No. PCT/CN2019/115591, Jun. 30, 2020, WIPO, 12 pages.

(Continued)

*Primary Examiner* — Mark W Tornow
(74) *Attorney, Agent, or Firm* — McCoy Russell LLP (57) ABSTRACT

An array substrate, a method of manufacturing the array substrate, and a display device are provided. The array substrate includes: a transparent rigid base; light-emitting chips on the transparent rigid base, each light-emitting chip including a chip body and a pin coupled to the chip body, a light-exiting surface of the chip body facing towards the transparent rigid base, and the pin being on a side of the chip body facing away from the transparent rigid base; a driving (Continued)

wire layer on a side of the pin facing away from the transparent rigid base; and a driving chip structure on a side of the driving wire layer facing away from the transparent rigid base. The driving chip structure is coupled to pins of the plurality of light-emitting chips through the driving wire layer, and is used for provide driving signals for the light-emitting chips.

17 Claims, 4 Drawing Sheets

(51) Int. Cl.
 *H01L 33/58* (2010.01)
 *H01L 33/62* (2010.01)
(52) U.S. Cl.
 CPC ...... *H01L 33/62* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 2016/0351539 | A1 | 12/2016 | Bower et al. |
| 2019/0371974 | A1* | 12/2019 | Hussell ................... G09G 3/32 |
| 2020/0359499 | A1* | 11/2020 | Hwu ..................... H10K 59/131 |
| 2021/0057624 | A1* | 2/2021 | Sun ...................... H05K 1/0296 |
| 2021/0296394 | A1 | 9/2021 | Meng et al. |
| 2022/0037571 | A1* | 2/2022 | Lin ......................... H01L 33/10 |
| 2022/0093578 | A1* | 3/2022 | Lin ....................... H01L 25/162 |

FOREIGN PATENT DOCUMENTS

| | | |
|---|---|---|
| CN | 109103176 A | 12/2018 |
| CN | 110071154 A | 7/2019 |
| CN | 110164901 A | 8/2019 |
| CN | 110379322 A | 10/2019 |

OTHER PUBLICATIONS

State Intellectual Property Office of the People's Republic of China, Office Action and Search Report Issued in Application No. 201980002305.7, Jun. 13, 2022, 14 pages. (Submitted with Partial Translation).

\* cited by examiner

ARRAY SUBSTRATE, METHOD OF MANUFACTURING THE SAME, AND DISPLAY DEVICE

CROSS REFERENCE TO RELATED APPLICATION

The present application is a U.S. National Phase of International Application No. PCT/CN2019/115591 entitled "ARRAY SUBSTRATE, METHOD OF MANUFACTURING THE SAME, AND DISPLAY DEVICE," and filed on Nov. 5, 2019. The entire contents of the above-listed application are hereby incorporated by reference for all purposes.

TECHNICAL FIELD

The present disclosure relates to the field of display technology, in particular, relates to an array substrate, a method of manufacturing the array substrate, and a display device.

BACKGROUND

With ever-growing development of display technology, a micro light-emitting diode (Micro Light-emitting Diode, hereinafter referred to as: Micro LED) display technology, and a mini light-emitting diode (Mini Light-emitting Diode, hereinafter referred to as: Mini LED) display technology gradually emerge due to with advantages of self-luminescence, low power consumption, high color saturation, and the like The Micro LED display technology is an LED miniaturization and matrix technology, that is, LED units are thinned, miniaturized, and arrayed. The LED units may be made be smaller than 100 microns, and can achieve individual addressing of each LED unit and individual light-emitting of each LED unit. A Mini LED is also called a sub-millimeter light-emitting diode, and is an LED with a size of about 100 microns or more.

SUMMARY

An objective of the present disclosure is to provide an array substrate, a method of manufacturing the array substrate, and a display device.

To achieve the above objective, the following technical solutions are provided.

A first aspect of the present disclosure provides an array substrate. The array substrate includes: a transparent rigid base; a plurality of light-emitting chips on the transparent rigid base, wherein each of the plurality of light-emitting chips includes a chip body and a pin coupled to the chip body, and a light-emitting surface of the chip body faces towards the transparent rigid base, the pin is on a side, facing away from the transparent rigid base, of the chip body; a driving wire layer on a side, facing away from the transparent rigid base, of the pin; and a driving chip structure on a side, facing away from the transparent rigid base, of the driving wire layer, wherein the drive chip structure is coupled to pins of the plurality of light-emitting chips through the driving wire layer and is used to provide a driving signal for the plurality of light-emitting chips.

Optionally, the array substrate further includes: a first light-transmitting colloidal layer between the transparent rigid base and the plurality of light-emitting chips, wherein the chip body included in each of the plurality of light-emitting chips is bonded to the transparent rigid base through the first light-transmitting colloidal layer.

Optionally, the first light-transmitting colloidal layer includes a light-diffusing particle.

Optionally, the array substrate further includes: a second light-transmitting colloidal layer on a side, facing away from the plurality of light-emitting chips, of the transparent rigid base, wherein the second light-transmitting colloidal layer includes a light-diffusing particle.

Optionally, the array substrate further includes: a first protective layer, at least including a first portion filled between chip bodies.

Optionally, the first protective layer further includes: a second portion, on a surface, facing away from the transparent rigid base, of the chip bodies, wherein the second portion is provided with a plurality of openings, and each pin is located in a corresponding one of the plurality of opening in a one-to-one correspondence, the second portion is used to flatten a side, facing away from the transparent rigid base, of the chip bodies.

Optionally, the first protective layer includes a light-shielding colloidal layer or a light-transmitting colloidal layer.

Optionally, each of the plurality of light-emitting chips includes a first pin and a second pin; the driving wire layer includes a plurality of first conductive connection wires and a plurality of second conductive connection wires, the plurality of first conductive connection wires is used to couple first pins of at least part of the plurality of light-emitting chips together, and couple the first pins to the driving chip structure; the plurality of second conductive connection wires is used to couple second pins of the plurality of light-emitting chips to the driving chip structure.

Optionally, the plurality of first conductive connection wires and the plurality of second conductive connection wires are arranged in a same layer.

Optionally, the plurality of first conductive connection wires and the plurality of second conductive connection wires are distributed in different conductive layers, and an insulating layer is provided between adjacent conductive layers.

Optionally, a first pad is provided on a side, facing away from the transparent rigid base, of the first pin, and the first pin is coupled to a corresponding first conductive connection wire through the first pad; a second pad is provided on a side, facing away from the transparent rigid base, of the second pin, and the second pin is coupled to a corresponding second conductive connection wire through the second pad.

Optionally, the array substrate is divided into at least two light-emitting areas, and each of the at least two light-emitting areas includes multiple of the plurality of light-emitting chips; the driving chip structure includes at least two driving chips corresponding to the at least two light-emitting areas in a one-to-one correspondence, and the plurality of first conductive connection wires is used to couple first pins included in a same light-emitting area together, and the first pins are coupled to a corresponding driving chip of the at least two driving chips, the plurality of second conductive connection wires is used to couple second pins included in a same light-emitting area with a corresponding driving chip of the at least two driving chips.

Optionally, the array substrate further includes a power supply motherboard, coupled to the driving chip structure through a flexible circuit board, and used to provide a control signal for the driving chip structure.

Optionally, the array substrate further includes a second protective layer on a side, facing away from the transparent rigid base, of the driving chip structure.

Based on the technical solution of the array substrate, a second aspect of the present disclosure provides a display device. The display device includes the array substrate provided above.

Optionally, the display device further includes a display panel on a light-exiting side of the array substrate, the display panel includes a driving circuit board, a counter substrate arranged opposite to the driving circuit board, and a liquid crystal layer between the driving circuit board and the counter substrate, and the driving circuit board is between the array substrate and the counter substrate.

Based on the technical solution of the above array substrate, a third aspect of the present disclosure provides a method of manufacturing an array substrate, the method being used to manufacture the array substrate. The method includes: providing a transparent rigid base; arranging a plurality of light-emitting chips on the transparent rigid base, wherein each of the plurality of light-emitting chips includes a chip body and a pin coupled to the chip body, and a light-emitting surface of the chip body faces towards the transparent rigid base, the pin is on a side, facing away from the transparent rigid base, of the chip body; manufacturing a driving wire layer on a side, facing away from the transparent rigid base, of the pin; binding a driving chip structure on a side, facing away from the transparent rigid base, of the driving wire layer, wherein the driving chip structure is coupled to pins of the plurality of light-emitting chips through the driving wire layer and is used for providing a driving signal for the plurality of light-emitting chips.

Optionally, arranging the plurality of light-emitting chips on the transparent rigid base specifically includes: forming a liquid or semi-solid colloidal material mixed with light-diffusing particles; forming a first transparent colloidal layer on the transparent rigid base using the colloidal material; attaching the plurality of light-emitting chips on a side, facing away from the transparent rigid base, of the first light-transmitting colloidal layer. The manufacturing method further includes: forming a first protective layer after arranging the plurality of light-emitting chips, wherein the first protective layer includes a first portion filled between chip bodies and a second portion on a surface, facing away from the transparent rigid base, of the chip bodies, the second portion is provided with a plurality of openings, each pin is located in a corresponding one of the plurality of opening in a one-to-one correspondence, the second portion is used to flatten a side, facing away from the transparent rigid base, of the chip bodies.

Optionally, the manufacturing method further includes: forming a second light-transmitting colloidal layer on a side, facing away from the plurality of light-emitting chips, of the transparent rigid base using the colloidal material.

Optionally, when each of the light-emitting chips includes a first pin and a second pin, manufacturing the driving wire layer and binding the driving chip structure specifically includes: manufacturing a first pad on a surface, facing away from the transparent rigid base, of the first pin; manufacturing a second pad on a surface, facing away from the transparent rigid base, of the second pin; manufacturing a plurality of first conductive connection wires on a side, facing away from the transparent rigid base, of the first pad, and manufacturing a plurality of second conductive wires on a side, facing away from the transparent rigid base, of the second pad; binding the driving chip structure on a side, facing away from the transparent rigid base, of the first conductive connection wires, and on a side, facing away from the transparent rigid base, of the second conductive connection wires, wherein the plurality of the first conductive connection wires couple at least part of first pads together, and couple the first pads to the driving chip structure; the plurality of second conductive connection wires couple second pads to the driving chip structure; manufacturing a second protective layer on a side, facing away from the transparent rigid base, of the driving chip structure.

BRIEF DESCRIPTION OF THE FIGURES

The drawings described herein are used to facilitate further understanding of the present disclosure and constitute a part of the present disclosure. The exemplary embodiments and descriptions of the present disclosure are used to explain the present disclosure, and do not constitute improper limitation of the present disclosure.

DETAILED DESCRIPTION

In order to further explain the array substrate, the method of manufacturing the array substrate, and the display device provided by the embodiments of the present disclosure, a detailed description will be given below in conjunction with the accompanying drawings of the specification.

In a case that the array substrate provided by the present disclosure uses an FPC (flexible circuit board) substrate or a PCB (printed circuit board) substrate, the array substrate mainly includes a following structure.

Figure 1:
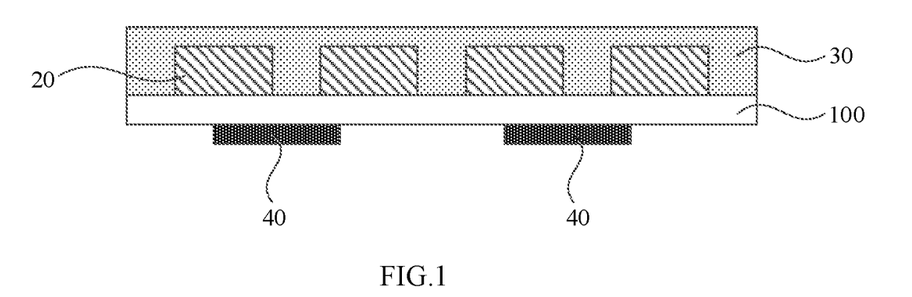
FIG. 1 is a structural schematic diagram of an array substrate using an FPC substrate or a PCB substrate.

As shown in FIG. 1, the array substrate includes: an FPC substrate or a PCB substrate (marked with 100 in FIG. 1), a circuit trace being on the FPC substrate or the PCB substrate; a light-emitting chip 20 on the FPC substrate or the PCB substrate; a driving chip 40 on a side, facing away from the light-emitting chip 20, of the FPC substrate or the PCB substrate, wherein the driving chip 40 is coupled to the FPC substrate or the PCB substrate through a via hole and a circuit trace arranged on the FPC substrate or the PCT substrate and is configured to provide a driving signal for the light-emitting chip 20. The light-emitting chip 20 can realize self-luminescence under driving of the driving signal and become a light source of the array substrate. The array substrate may further include a protective colloidal layer 30 covering the light-emitting chip 20 for protecting the light-emitting chip 20.

Warpage detection was performed on 13 array substrates using PCB substrates, and 6 test areas were selected on each array substrate. If a warpage value of the area was greater than 0.4 mm, it was determined that the area has poor warpage.

Specific test data is shown in Table 1 below. The numbers 1 to 13 on the left in Table 1 represent a n-th array substrate, and the numbers 1 to 6 in the first row of Table 1 represent 6 test areas. It can be seen from Table 1 that in the fifth/sixth/seventh/twelfth array substrates, there is a poor warpage area. If the 13 array substrates are spliced to form a display device, a poor warpage ratio of the display device can be obtained, which is about 31%.

TABLE 1

| Numbers | Warpage values (mm) corresponding to six test areas | | | | | | poor warpage ratio |
| --- | --- | --- | --- | --- | --- | --- | --- |
| | 1 | 2 | 3 | 4 | 5 | 6 | |
| 1 | 0.4 | 0.3 | 0.3 | 0 | 0 | 0 | 31% |
| 2 | 0.15 | 0 | 0 | 0 | 0 | 0 | |
| 3 | 0.2 | 0 | 0 | 0 | 0 | 0 | |
| 4 | 0.3 | 0 | 0.35 | 0 | 0.3 | 0 | |
| 5 | 0.75 | 0.7 | 0 | 0.35 | 0.8 | 0.8 | |
| 6 | 0 | 0.3 | 0.8 | 0.3 | 0.5 | 0 | |
| 7 | 0 | 0.6 | 1 | 0.9 | 0.8 | 0 | |
| 8 | 0.15 | 0 | 0 | 0 | 0 | 0.1 | |
| 9 | 0.3 | 0 | 0 | 0 | 0 | 0 | |
| 10 | 0.25 | 0 | 0 | 0 | 0 | 0 | |
| 11 | 0.1 | 0 | 0 | 0 | 0.1 | 0 | |
| 12 | 0 | 0.2 | 0.7 | 0.15 | 0 | 0 | |
| 13 | 0.1 | 0 | 0 | 0 | 0 | 0.1 | |

Regarding above test results, the inventors of the present disclosure have discovered through research that when the FPC substrate or the PCB substrate is used as a base substrate of the array substrate, significant warpage is likely to occur in practical applications due to material expansion and contraction phenomena of the FPC substrate and the PCB substrate. The warpage further adversely affects an assembly process of the array substrate and a light-emitting effect of the array substrate.

Based on the above-mentioned problems when using the FPC substrate or the PCB substrate, the inventors of the present disclosure consider replacing the FPC substrate or the PCB substrate with a glass substrate. Since the glass substrate is relatively harder than the FPC substrate or the PCB substrate, the array substrate made of the glass substrate is unlikely warped. However, it is difficult to make a via hole on the glass substrate based on a current level of technology. Based on this, the present disclosure provides an array substrate with a following structure.

Figure 2:
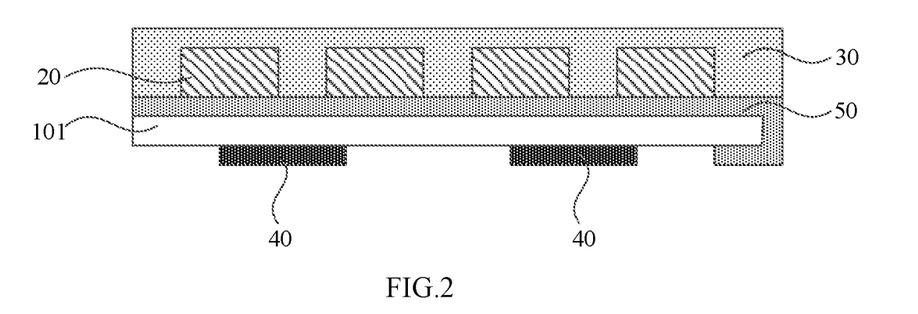
FIG. 2 is a structural schematic diagram of an array substrate using a glass substrate.

As shown in FIG. 2, the array substrate includes: a glass substrate 101, where a circuit trace can be formed by using a surface deposition copper process; a light-emitting chip 20 on the glass substrate 101; a driving chip 40 on a side, facing away from the light-emitting chip 20, of the glass substrate 101; a side-edge trace 50 on a edge of the glass substrate 101, the side-edge trace 50 is used to connect a trace on the side where the light-emitting chip 20 is located on the glass substrate 101, with a trace on the side where the driving chip 40 is located on the glass substrate 101. A driving signal provided by the driving chip 40 sequentially passes through the trace on the side where the driving chip 40 is formed on the glass substrate 101, through the side-edge trace 50, and through the trace on the side where the light-emitting chip 20 is formed on the glass substrate 101, and drives the light-emitting chip 20 to emit light.

In the array substrate having the structure shown in FIG. 2, coupling between the driving chip 40 and the light-emitting chip 20 is realized by providing the side-edge traces 50, resulting in that the array substrate cannot adopt a narrow frame design. Moreover, when a plurality of array substrates of this structure are spliced to form a large-size display device, a wider splicing gap must be left between the array substrates due to the side-edge trace 50, and a display quality of the display device formed by splicing is adversely affected.

Based on existence of the above-mentioned problem, the inventors of the present disclosure have further studied and found that arrangement of the light-emitting chip 20, the driving chip 40 and the substrate can be adjusted to solve the warpage problem, the problem, caused by the side-edge trace 50, that the array substrate cannot adopt the narrow frame design, and the problem that a wider splicing gap exists between the array substrates when splicing the array substrates to form a large-size display device and the display quality of the display device formed by splicing is adversely affected.

Figure 3:
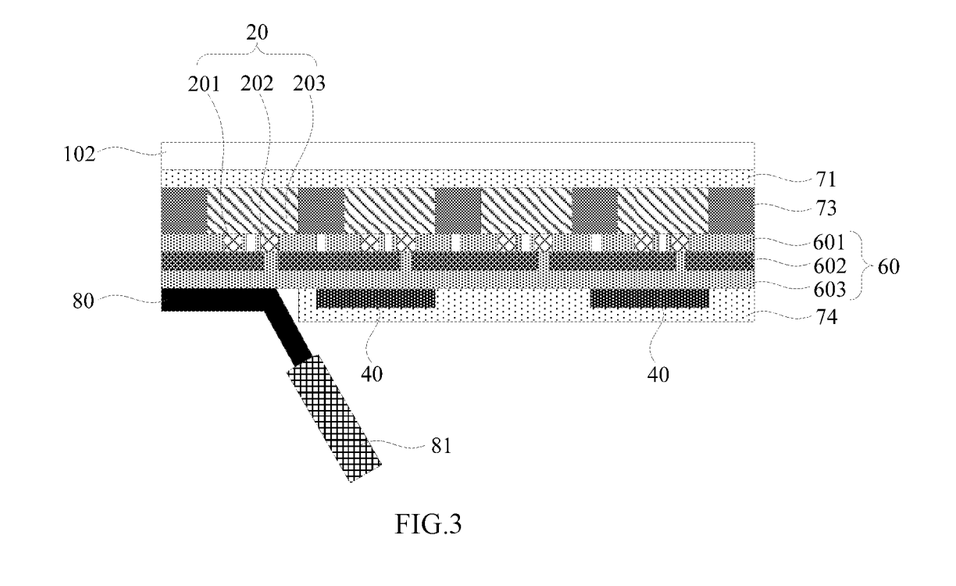
FIG. 3 is a first structural schematic diagram of an array substrate provided by embodiments of the present disclosure.

Referring to FIG. 3, an embodiment of the present disclosure provides an array substrate. The array substrate includes: a transparent rigid base 102; a plurality of light-emitting chips 20 on the transparent rigid base 102, each of the plurality of light-emitting chips 20 including a chip body 203 and pins (such as a first pin 201 and a second pin 202) coupled to each other, a light-emitting surface of the chip body 203 facing the transparent rigid base 102, and the pins being on a side, facing away from the transparent rigid base 102, of the chip body 203; a driving wire layer 60 on a side, facing away from the transparent rigid base, of the pin 102, and a driving chip structure (including the driving chip 40) on a side, facing away from the transparent rigid base 102, of the driving wire layer 60, the driving chip structure being coupled to the pins of the plurality of light-emitting chips 20 through the driving wire layer 60 and used for providing driving signals for the plurality of light-emitting chips 20.

Specifically, a specific type of the transparent rigid base 102 can be selected according to actual needs, as long as it has good light transmission performance, has a certain hardness, and is not prone to warpage. For example, the transparent rigid base 102 includes a glass substrate, but is not limited thereto.

The light-emitting chip 20 includes the chip body 203 and pins arranged on the chip body 203. The chip body 203 has a light-emitting surface, and the pins can be arranged on a surface, opposite to the light-emitting surface, of the chip body 203. The pins are used to receive a driving signal provided by the outside, and the chip body 203 emits light from the light-emitting surface under a control of the driving signal.

When the plurality of light-emitting chips 20 are arranged on the transparent rigid base 102, the light-emitting surface of the chip body 203 of the light-emitting chip 20 may face the transparent rigid base 102, so that light emitted from the light-emitting surface of the chip body 203 can directly pass through the transparent rigid base 102 and exit the array substrate to realize a self-luminous function of the array substrate.

Because when a light-emitting surface of the chip body 203 of the light-emitting chip 20 faces the transparent rigid base 102, the pins of the light-emitting chip 20 are exposed on a side, facing away from the transparent rigid base 102, of the chip body 203. Therefore, the driving wire layer and the driving chip structure can be directly arranged on the side, facing away from the transparent rigid base 102, of the pins, so that the driving chip structure can be coupled to the pins of the plurality of light-emitting chips 20 through the driving wire layer 60, to provide driving signals for the plurality of light-emitting chips 20.

An actual operational process of the above-mentioned array substrate includes: providing driving signals by the driving chip structure, the driving signals being transmitted to the pins of the light-emitting chip 20 via traces located in the driving wire layer 60, so that the chip body 203 in the light-emitting chip 20 emits light under driving of the driving signal, and the emitted light can be emitted from the light-emitting surface of the chip body 203 and emitted out from the array substrate through the transparent rigid base 102, to realize a light-emitting function of the array substrate.

According to a specific structure and a working process of the above-mentioned array substrate, the transparent rigid base 102 is used in the array substrate provided by the embodiments of the present disclosure, so that the formed array substrate is not prone to warpage during a manufacturing process of the array substrate and in practical applications. This ensures an assembly process of the array substrate to be smooth and a good light-emitting effect of the array substrate. Moreover, in the array substrate provided by the embodiments of the present disclosure, the light-emitting side of the chip body 203 of the light-emitting chip 20 faces towards the transparent rigid base 102, and the pins of the light-emitting chip 20 are disposed facing away from the transparent rigid base 102, so that the driving wire layer 60 and the driving chip structure can be directly arranged on the side where the pins of the light-emitting chip 20 are located, so as to provide driving signals for the light-emitting chips 20, which avoids a perforation process of perforating the base of the array substrate and eliminates a need for forming the side-edge traces, which is more conducive to the narrow frame design of the array substrate, and when the array substrates are spliced to form a large-size display device, the gaps between the array substrates are narrow, which ensures the display quality of the display device formed by splicing.

Figure 8:
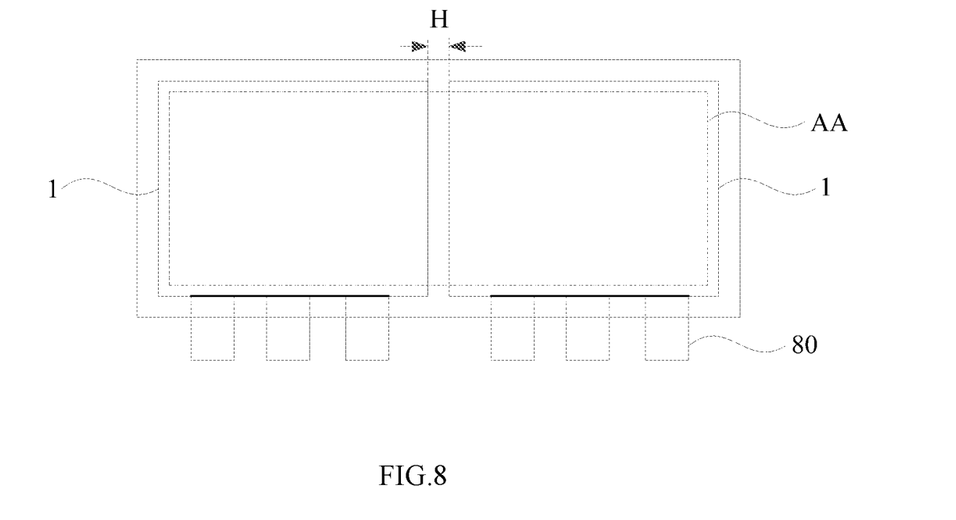
FIG. 8 is a schematic diagram of splicing an array substrate provided by the embodiments of the present disclosure.

Further, as shown in FIG. 8, the display device provided by the embodiment of the present invention includes two array substrates 1. A size of the transparent rigid base in each array substrate 1 is 301.045 mm×345.45 mm, a size of the light-emitting chip is 4.187 mm×4.75 mm, 4.18 mm is a horizontal size, and 4.75 mm is a vertical size. The array substrate 1 can be divided into areas. The number of the areas is 576, and the number of light-emitting chips that can be set in each area is 9; the total number of light-emitting chips included in the array substrate is 5184. A power supply motherboard can be coupled to the driving chip through 3 FPCs 80 to realize power supply for the driving chip.

When the multiple array substrates 1 with the above structure are spliced together, a gap H between adjacent array substrates can reach 0.05 mm, or even close to zero. AA in FIG. 8 represents a display screen area of the display device formed after splicing.

As shown in FIG. 3, in some embodiments, the array substrate may further include a first light-transmitting colloidal layer 71 disposed between the transparent rigid base 102 and the plurality of light-emitting chips 20, the chip body 203 included in the plurality of light-emitting chips 20 is bonded on the transparent rigid base 102 through the first light-transmitting colloidal layer 71.

Specifically, the light-emitting chip 20 can be fixed on the transparent rigid base 102 in a variety of ways. For example, a first light-emitting adhesive layer 71 is firstly formed on a side, where the light-emitting chip 20 is arranged, of the transparent rigid base 102. The first light-transmitting colloidal layer 71 is then pasted on the light-emitting surface of the chip body 203 included in the light-emitting chip 20.

It is worth noting that when the first light-transmitting colloidal layer 71 is made, the first light-transmitting colloidal layer 71 may be made on the transparent rigid base 102 by using a liquid or semi-solid light-transmitting colloidal material, and then the light-emitting surface of the chip body 203 of the light-emitting chip 20 is attached onto the first light-transmitting colloidal layer 71, and finally the first light-transmitting colloidal layer 71 attached with the light-emitting chip 20 is cured to fix the light-emitting chip 20 onto the first light-transmitting colloidal layer 71.

In the array substrate provided by the foregoing embodiment, the first light-transmitting colloidal layer 71 is disposed between the transparent rigid base 102 and the light-emitting chip 20, which not only enables the light-emitting chip 20 to be firmly fixed on the transparent rigid base 102 through the first light-transmitting colloidal layer 71, but also enables light emitted by the light-emitting chip 20 to pass through the first light-transmitting colloidal layer 71 and the transparent rigid base 102 to exit the array substrate, thereby ensuring good light-emitting performance of the array substrate.

Figure 4:
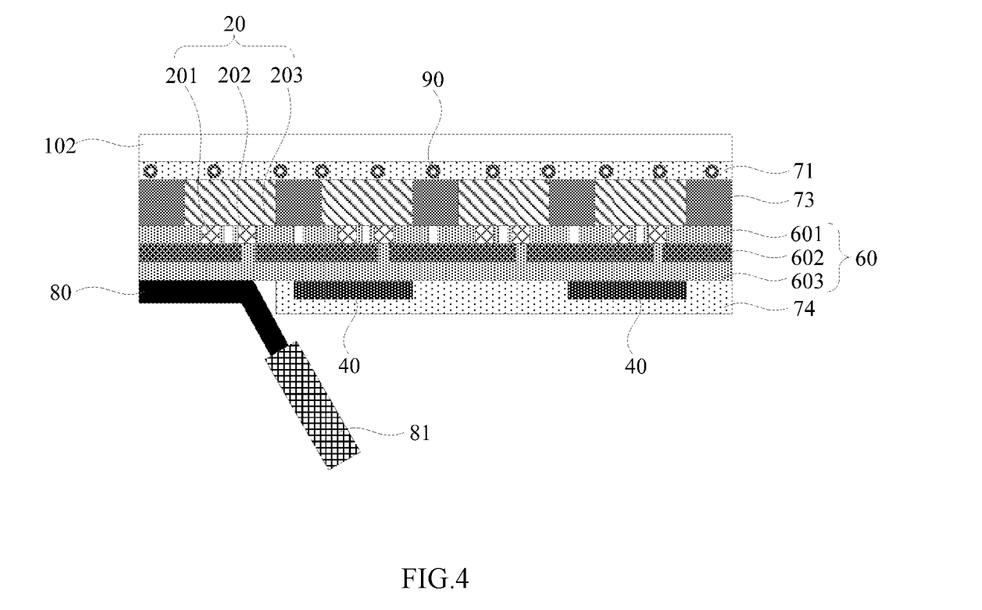
FIG. 4 is a second structural schematic diagram of an array substrate provided by the embodiments of the present disclosure.

As shown in FIG. 4, in some embodiments, the first light-transmitting colloidal layer 71 includes light-diffusing particle 90.

Specifically, specific types of the light-diffusing particles 90 can be selected according to actual needs. For example, organic silicon light-diffusing particle are selected. In a case that the first light-transmitting colloidal layer 71 includes the light-diffusing particles, and when light passes through the first light-transmitting colloidal layer 71, the light-diffusing particles 90 can change the original transmission direction of the light, thereby enhancing diffusion of the light emitted from the transparent rigid base 102, so that when the array substrate is used as a direct type backlight module in a display device, an optical distance (Optical Distance, OD for short) is reduced effectively, which is more conducive to a thinner size of the display device.

Figure 5:
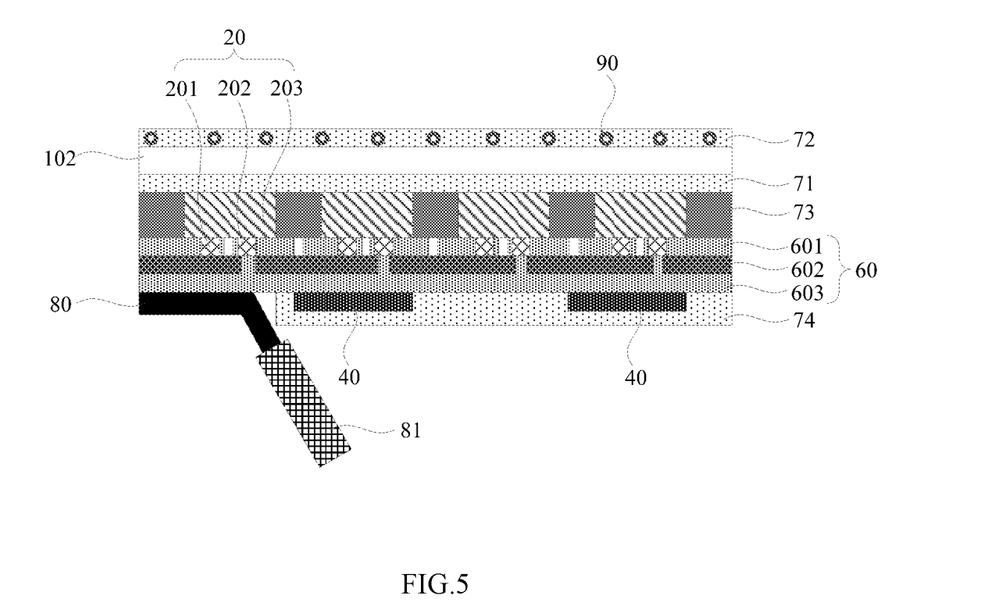
FIG. 5 is a third structural schematic diagram of an array substrate provided by the embodiments of the present disclosure.
Figure 6:
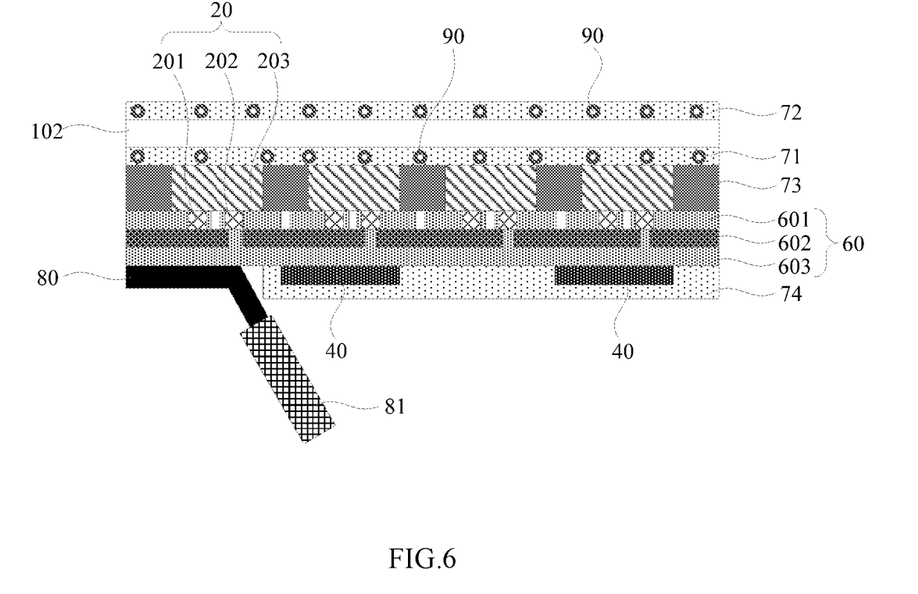
FIG. 6 is a fourth structural schematic diagram of an array substrate provided by the embodiments of the present disclosure.

As shown in FIG. 5 and FIG. 6, in some embodiments, the array substrate may further include a second light-transmitting colloidal layer 72 on a side, facing away from the plurality of light-emitting chips 20, of the transparent rigid base 102. The second light-transmitting colloidal layer 72 includes light-diffusing particles 90.

Specifically, when the array substrate is used as a backlight module in a display device, the second light-transmitting colloidal layer 72 may be provided on the side, facing away from the light-emitting chip 20, of the transparent rigid base 102, so that the array substrate can be fixedly bonded to a display panel of the display device through the second light-transmitting colloidal layer 72.

Since the second light-transmitting colloidal layer 72 has good light-transmitting properties, and the second light-transmitting colloidal layer 72 includes light-diffusing particles 90, the light-diffusing particles 90 can change the original transmission direction of light when the light passes through the second light-transmitting colloidal layer 72, thereby further improving diffusion of the light emitted from the transparent rigid base 102, so that when the array substrate is used as a direct type backlight module in a display device, the OD value can be further reduced, which is more conducive to a thinner size of the display device.

It should be noted that specific distributions of the light-diffusing particles 90 included in the first light-transmitting colloidal layer 71 and the light-diffusing particles 90 included in the second light-transmitting colloidal layer 72 can be set according to actual needs. For example, the light-diffusing particles 90 are uniformly distributed in the first light-transmitting colloidal layer 71 and/or the second light-transmitting colloidal layer 72; or, a density of the light-diffusing particles 90 in a certain area of the first light-transmitting colloidal layer 71 and/or the second light-transmitting colloidal layer 72 is relatively larger, and a density of the light-diffusing particles 90 in other areas of the first light-transmitting colloidal layer 71 and/or the second light-transmitting colloidal layer 72 is relatively smaller.

Figure 7:
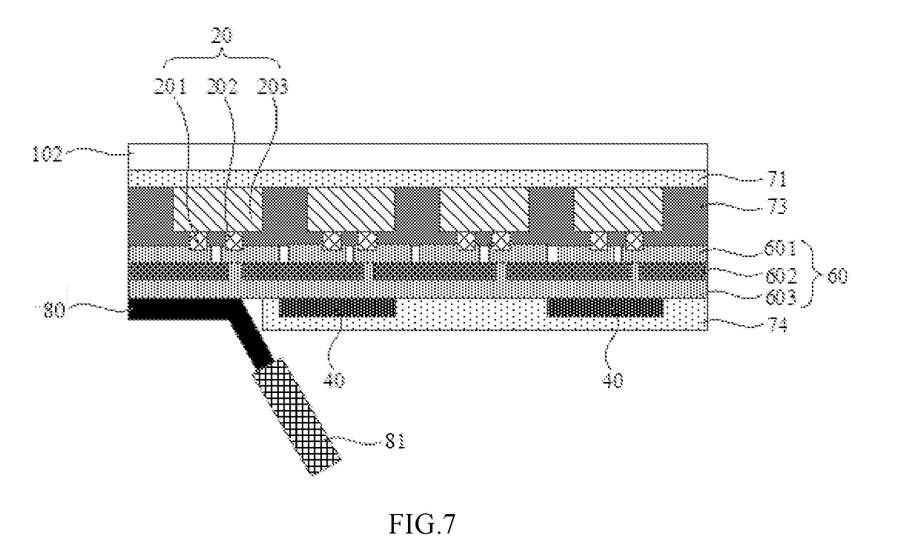
FIG. 7 is a fifth structural schematic diagram of an array substrate provided by the embodiments of the present disclosure.

As shown in FIG. 7, in some embodiments, the array substrate further includes a first protective layer 73, and the first protective layer 73 at least includes a first portion filled between the chip bodies 203.

Specifically, when the plurality of light-emitting chips 20 are arranged on the transparent rigid base 102, specific arrangements of the plurality of light-emitting chips 20 are various. For example, the plurality of light-emitting chips 20 are distributed on the transparent rigid base 102 in a matrix, and in this distribution, adjacent light-emitting chips 20 of the plurality of light-emitting chips 20 can also be arranged at equal intervals.

When the light-emitting chips 20 are arranged in the above distribution, the first protective layer 73 may be provided on the side, on which the light-emitting chips 20 are arranged, of the transparent rigid base 102. The first protective layer 73 at least includes the first portion filled between the chip bodies 203, so that the first protective layer 73 to enclose the chip body 203 of each light-emitting chip 20, and effectively protects the chip body 203 of each light-emitting chip 20, thereby improving a service life of the light-emitting chip 20.

It is worth noting that specific materials of the above-mentioned first protective layer 73 are various. For example, the first protective layer 73 is made of a colloidal material, so that not only the first protective layer 73 can be bonded to the light-emitting chips 20, side walls of the chip body 203 in each light-emitting chip 20 can also be bonded to the first light-transmitting colloidal layer through the first protective layer 73, which enhances firmness of the light-emitting chip 20 and is beneficial to improve reliability of the array substrate.

Continue to refer to FIG. 7, in some embodiments, the first protective layer 73 further includes: a second portion on a surface, facing away from the transparent rigid base 102, of each chip body 203. The second portion is provided with a plurality of openings, and the pins are located in the openings in a one-to-one correspondence, and the second portion is used to flatten the side, facing away from the transparent rigid base 102, of each chip body 203.

Specifically, in addition to the first portion, the first protective layer 73 may also include a second portion on the surface, facing away from the transparent rigid base 102, of each chip body 203, and a plurality of openings corresponding to the pins of the light-emitting chips 20 in a one-to-one correspondence is arranged on the second portion, and the pins of the light-emitting chips 20 are located in the openings in a one-to-one correspondence.

It is worth noting that a depth of each opening in a direction perpendicular to the transparent rigid base 102 can be set according to actual needs. For example, in the direction perpendicular to the transparent rigid base 102, the depth of the opening is less than, equal to or greater than a thickness of the pin; when the depth of the opening is less than the thickness of the pin, the pin can protrude from the opening in a direction away from the transparent rigid base 102; when the depth of the opening is equal to the thickness of the pin, a surface of the pin facing away from the transparent rigid base 102 can be in a same plane as an edge of the opening away from the transparent rigid base 102; when the depth of the opening is greater than the thickness of the pin, the pin is completely encompassed in a space defined by the opening.

For the above three cases, a specific structure of a conductive connection wire coupled with the pin can be adjusted to achieve good coupling between the pin and the conductive connection wire.

The above-mentioned arrangement of the first protective layer 73 including the first portion and the second portion, enables the first protective layer 73 to protect sidewalls of the chip body 203 of the light-emitting chip 20 and a surface of the chip body 203 facing away from the transparent rigid base 102, so as to better improve reliability of the light-emitting chip 20 in practical applications. Moreover, by providing the first protective layer 73 including the second portion, the second portion can flatten a side, facing away from the transparent rigid base 102, of each chip body 203. When the driving wire layer 60 is formed at a later time, the driving wire layer 60 can be directly formed on the surface, facing away from the transparent rigid base 102, of the second portion, which not only facilitates production of the driving wire layer 60, but also is more convenient for conductive connection wires in the driving wire layer 60 to be coupled to the pins of the light-emitting chip 20.

In some embodiments, the first protective layer 73 includes a light-shielding colloid layer or a light-transmitting colloid layer.

Specifically, a specific material of the first protective layer 73 can be set according to actual needs. For example, when the array substrate is applied to a backlight module, the first protective layer 73 can be set to include a light-transmitting colloid layer. This is more conducive to improving a light-emitting efficiency of the array substrate; and when the array substrate is directly used for display, the first protective layer 73 can be provided to include a light-shielding colloid layer, which is more conducive to improving cross-color interference between adjacent light-emitting chips 20.

It is worth noting that the light-shielding colloid layer can be made of a dark colloid material, but it is not limited to this.

In some embodiments, it may be provided that each of the light-emitting chips 20 includes a first pin 201 and a second pin 202; the driving wire layer 60 includes: a plurality of first conductive connection wires and a plurality of second conductive connection wires. The plurality of first conductive connection wires is used to couple first pins 201 of at least part of light-emitting chips 20 together, and to couple the first pins 201 to the driving chip structure; the plurality of second conductive connection wires is used to couple second pins 202 of the light-emitting chips 20 to the driving chip structure, respectively.

Specifically, each of the light-emitting chips 20 may be configured to include a first pin 201 and a second pin 202. Illustratively, the first pin 201 is an anode, and the second pin 202 is a cathode; or, the first pin 201 is a cathode, and the second pin 202 is an anode.

When the first pin 201 and the second pin 202 are coupled to the driving chip structure by the driving wire layer 60, manners of the coupling are various. For example, the driving wire layer 60 be configured to include a plurality of first conductive connection wires and a plurality of second conductive connection wires, and the plurality of first conductive connection wires is used to couple the first pins 201 of at least part of the light-emitting chips 20 together, and couple the first pins 201 to the driving chip structure; the plurality of second conductive connection wires are used to couple the second pins 202 of the light-emitting chips 20 to the driving chip structure.

When the first pin 201 is an anode, the coupling manner enables the plurality of light-emitting chips 20 to form a common anode coupling manner. When the plurality of light-emitting chips 20 are driven to emit light, the driving chip structure can provide the same common anode signal for the anode of each light-emitting chip 20, and provide a corresponding cathode signal for the cathode of each light-emitting chip 20, so that light-emitting brightness of each light-emitting chip 20 can be individually controlled.

When the first pin 201 is a cathode, the above coupling manner enables the plurality of light-emitting chips 20 to form a common cathode coupling manner. When the plurality of light-emitting chips 20 are driven to emit light, the driving chip structure may provide the same common cathode signal to the cathode of each light-emitting chip, and provide a corresponding anode signal to the anode of each light-emitting chip 20, so as to realize individual control of light-emitting brightness of each light-emitting chip 20.

When manufacturing the driving wire layer 60, in a case that the first protective layer 73 includes the second portion, a conductive material can be directly used to form the plurality of first conductive connection wires and the plurality of second conductive connection wires on the surface, facing away from the transparent rigid base 102, of the second portion. A specific layout of the first conductive connection wires and the second conductive connection wires can be configured according to actual needs, under a premise that the driving chip structure can drive each of the light-emitting chips 20 through the first conductive connection wires and the second conductive connection wires.

In the array substrate provided by the foregoing embodiment, the driving wire layer 60 is formed on the side, facing away from the transparent rigid base 102, of the chip body 203 of the light-emitting chip 20; and the driving chip structure is formed on the side, facing away from the transparent rigid base 102, of the driving wire layer 60. The driving wire layer 60 includes the first conductive connection wires and the second conductive connection wires, so that the driving chip structure can directly drive each of the light-emitting chips 20 individually through the first conductive connection wire and the second conductive connection wire, which not only avoids a process of perforating the base in the array substrate, but also does not need to form the side-edge trace. Therefore, it is more conducive to implement a narrow frame design of the array substrate, and when the array substrates are spliced to form a large-size display device, the splicing gaps between the array substrates are relatively narrow, which ensures the display quality of the display device formed by the splicing.

In some embodiments, the plurality of first conductive connection wires and the plurality of second conductive connection wires are all arranged in the same layer.

Specifically, when the number of light-emitting chips 20 included in the array substrate is small, and the number of the first conductive connection wires and the second conductive connection wires required is small, the first conductive connection wires and the second conductive connection wire may use a larger layout space, and short circuiting unlikely happens between conductive connection wires. In this case, the first conductive connection wires and the second conductive connection wires can be arranged in the same layer, in order to avoid introducing too many layers in the array substrate, thereby this case is more conducive to a thinner size of the array substrate.

As shown in FIGS. 3-7, in some embodiments, the plurality of first conductive connection wires and the plurality of second conductive connection wires are distributed in different conductive layers (such as a first conductive layer 601 and a second conductive layer 603), and an insulating layer 602 is provided between adjacent conductive layers.

Specifically, when the number of light-emitting chips 20 included in the array substrate is large, and the required number of the first conductive connection wires and the second conductive connection wires is large, a layout space for the first conductive connection wires and the second conductive connection wires in the same layer is limited. If both the first conductive connection wires and the second conductive connection wires are arranged in the same layer, it is likely to cause a short-circuit phenomenon. In this case, the plurality of first conductive connection wires and the plurality of second conductive connection wires can be distributed in different conductive layers, and an insulating layer 602 is arranged between adjacent conductive layers. In this way, not only the layout space for the first conductive connection wire and the second conductive connection wire is enlarged, but also a through hole can be formed in the insulating layer 602 to ensure the coupling among the conductive connection wires, the pins and the driving chip structure.

It should be noted that, in FIGS. 3 to 7, a pattern connecting the first pin 201 and a pattern connecting the second pin 202 of a same light-emitting chip 20 in the first conductive layer 601 should be spaced apart and insulated from each other. Different light-emitting chips 20 can be connected in series or in parallel through the first conductive connection wires and the second conductive connection wires.

In some embodiments, a first pad is provided on the side, facing away from the transparent rigid base 102, of the first pin 201; and the first pin 201 is coupled to a corresponding first conductive connection wire through the first pad. A second pad is provided on the side, facing away from the transparent rigid base 102, of the second pin 202, and the second pin 202 is coupled to the corresponding second conductive connection wire through the second pad.

Specifically, the pins of each light-emitting chip 20 are generally made of gold metal, and the first conductive connection wire and the second conductive connection wire are generally made of copper metal. If the pins made of gold are directly coupled to the conductive connection wires made of copper, an effect of the coupling is not good, and the coupling is easy to be broken in actual application. Therefore, the first pad can be provided on the side of the first pin 201 facing away from the transparent rigid base 102, and the second pad is provided on the side of the second pin 202 facing away from the transparent rigid base 102, so that the first pin 201 can be coupled to the corresponding first conductive connection wire through the first pad, and the second pin 202 can be coupled to the corresponding second conductive connection wire through the second pad, thereby enhancing performance of the coupling between the pins and the conductive connection wires.

It is worth noting that a specific material of the pad can be selected according to actual needs, as long as the performance of the coupling between the pins and the conductive connection wires can be improved. Illustratively, a tin material is used to make the pad, but the present disclosure is not limited to this.

As shown in FIGS. 3 to 7, in some embodiments, the array substrate is divided into at least two light-emitting areas, each of the light-emitting areas includes a plurality of the light-emitting chips; the driving chip structure includes at least two driving chips 40 corresponding to the at least two light-emitting areas in a one-to-one manner, and the plurality of first conductive connection wires are used to couple the first pins 201 included in the same light-emitting area together, and the first pins 201 are coupled to the corresponding drive chip 40. The plurality of second conductive connection wires are used to connect the second pins 202 included in the same light-emitting area with the corresponding drive chips 40, respectively.

Specifically, a specific structure of the driving chip structure is diverse. For example, the driving chip structure can be configured to include at least one driving chip 40, and the specific number of the driving chip 40 can be determined based on the number of light-emitting chips needing to be driven in the array substrate. The larger the number of the light-emitting chips 20 is, the larger the number of the driving chips 40 needing to be provided is correspondingly.

When the array substrate includes a large number of light-emitting chips 20 and the light-emitting chips 20 are to be driven by a plurality of driving chips 40, the array substrate may be divided into a plurality of light-emitting areas corresponding to the plurality of driving chips 40 in a one-to-one manner, and each driving chip 40 is controlled to drive multiple light-emitting chips 20 in the corresponding light-emitting area. When using this driving fashion to drive the light-emitting chips 20 to emit light, the first conductive connection wire in the driving wire layer 60 can be configured to couple the first pins 201 included in the same light-emitting area together, and couple the first pins 201 to the corresponding driving chip 40. The plurality of second conductive connection wires can be configured to couple the second pins 202 included in the same light-emitting area to the corresponding driving chips 40, respectively.

Since the array substrate is divided into a plurality of light-emitting areas, and each of a plurality of driving chips 40 is configured to drive the plurality of light-emitting chips 20 in the corresponding light-emitting area, thereby not only ensuring a good driving performance for each light-emitting chip 20, but also making each light-emitting area be independently controlled, which is more conducive to rapid positioning and repairing when the array substrate is abnormal.

As shown in FIGS. 3-7, in some embodiments, the array substrate may further include a power supply motherboard 81, and the power supply motherboard 81 is coupled to the driving chip structure through a flexible circuit board 80 and is used for providing the driving chip structure with a control signal.

Specifically, the array substrate may further include a power supply motherboard 81 on which a power supply circuit is provided, and the power supply motherboard 81 may be coupled to the driving chip structure through the flexible circuit board 80 and is used for providing a control signal to the driving chip structure. Under the control of the control signal, the driving chip structure provides a driving signal for the light-emitting chips 20 to drive the light-emitting chips 20 to emit light.

The above-mentioned flexible circuit board 80 is used to fix the power supply mainboard 81 on a back side, opposite to the light-emitting surface, of the array substrate, so that the power supply mainboard 81 does not occupy a space of the light-emitting surface and a side space of the array substrate. This is more conducive to realization of the narrow frame design of the array substrate, and when the array substrates are spliced to form a large-size display device, the splicing gap between the array substrates is narrow, which ensures the display quality of the display device formed by splicing.

It is worth noting that by coupling the power supply motherboard 81 to the flexible circuit board 80, a specific position of the power supply motherboard 81 on the back side of the array substrate can be adjusted by bending the flexible circuit board 80.

As shown in FIGS. 3 to 7, in some embodiments, the array substrate further includes a second protective layer 74 on the side, facing away from the transparent rigid base 102, of the driving chip structure.

Specifically, after arranging the driving chip structure on the side of the driving wire layer 60 facing away from the transparent rigid base 102, the protective layer may further be manufactured on the side, facing away from the transparent rigid base 102, of the driving chip structure. The second protective layer 74 covers the driving chip structure and a portion, not covered by the driving chip structure, of the driving wire layer 60, so as to realize protection of the driving chip structure and the driving wire layer 60.

It is worth noting that a material of the second protective layer 74 can be selected according to actual needs. For example, a colloidal material is used to make the second protective layer 74, but the present disclosure is not limited to this.

The embodiments of the present disclosure also provide a display device, which includes the array substrate provided in the above embodiments.

The array substrate provided by the foregoing embodiments is not prone to warpage during a manufacturing process and actual application, thereby ensuring an assembly process of the array substrate to be implemented smoothly and a good light-emitting effect of the array substrate. Moreover, in the array substrate provided by the above-mentioned embodiments, the light-emitting side of the chip body 203 of the light-emitting chip 20 faces towards the transparent rigid base 102, and the pins of the light-emitting chip 20 are arranged facing away from the transparent rigid base 102, so that the driving wire layer 60 and the driving chip structure can be directly arranged on the side where the pins of the light-emitting chip 20 are located, and the driving signal can be provided for the light-emitting chip 20, which not only avoids the process of perforating the base in the array substrate, but also the side-edge traces 50 are not needed to be formed, and makes it more conducive to realization of the narrow frame design of the array substrate, and when splicing the array substrates to form a large-size display device, the gap between the array substrates is narrower, which ensures the display quality of the display device formed by splicing. Therefore, the display device provided by the embodiments of the present disclosure including the above array substrate also has the above-mentioned beneficial effects.

It should be noted that the display device may be any product or component with a display function such as a TV, a monitor, a digital photo frame, a mobile phone, a tablet computer, etc.

It is worth noting that when the array substrate provided in the above embodiment is applied to the display device provided in the embodiment of the present disclosure, the array substrate can be used as a backlight source in the display device or directly as a display panel in the display device.

When the array substrate is used as a backlight source in the display device, the display device further includes a display panel on the light-emitting side of the array substrate, the display panel includes a driving circuit board, a counter substrate arranged opposite to the driving circuit board, and a liquid crystal layer between the driving circuit board and the counter substrate, and the driving circuit board is between the array substrate and the counter substrate.

Specifically, the display panel may optionally be a liquid crystal display panel, and the liquid crystal display panel includes a driving circuit board, a counter substrate arranged opposite to the driving circuit board, and a liquid crystal layer between the driving circuit board and the counter substrate; a thin film transistor array layer is provided on the driving circuit board; the counter substrate can be specifically a color filter substrate; when the array substrate is used as the backlight source in the display device, the array substrate can be provided on the side, facing away from the counter substrate, of the driving circuit board, and the light-emitting surface of the array substrate faces towards the driving circuit board.

As shown in FIG. 3, an embodiment of the present disclosure also provides a method of manufacturing an array substrate, which is used to manufacture the array substrate provided in the above embodiment, and the method includes: providing a transparent rigid base 102; providing a plurality of light-emitting chips 20 on the transparent rigid base 102, wherein each of the plurality of light-emitting chips 20 includes a chip body 203 and a pin coupled to the chip body 203, and the light-emitting surface of the chip body 203 faces towards the transparent rigid base 102, the pin is located on the side of the chip body 203 facing away from the transparent rigid base 102; manufacturing a driving wire layer 60 on the side of the pin facing away from the transparent rigid base 102; binding a driving chip structure on the side of the driving wire layer 60 facing away from the transparent rigid base 102, wherein the driving chip structure is coupled to pins of the plurality of light-emitting chips 20 through the driving wire layer 60, and is used for providing driving signals for the plurality of light-emitting chips 20.

Specifically, a specific type of the transparent rigid base 102 can be selected according to actual needs, under a premise that the type of the transparent rigid base 102 has good light-transmissive performance, has a certain hardness, and is not prone to warpage. For example, the transparent rigid base 102 includes a glass substrate, but is not limited thereto.

The light-emitting chip 20 includes a chip body 203 and pins arranged on the chip body 203. The chip body 203 has a light-emitting surface, and the pins can be arranged on a surface of the chip body 203 opposite to the light-emitting surface. The pins are used to receive a driving signal provided from the outside, and the chip body 203 emits light from the light-emitting surface under a control of the driving signal.

When the plurality of light-emitting chips 20 is arranged on the transparent rigid base 102, the light-emitting surface of the chip body 203 of the light-emitting chip 20 may face towards the transparent rigid base 102, so that light emitted from the light-emitting surface of the chip body 203 can directly pass through the transparent rigid base 102 and exit the array substrate, to realize a self-luminous function of the array substrate.

When the light-emitting surface of the chip body 203 of the light-emitting chip 20 faces towards the transparent rigid base 102, the pins of the light-emitting chip 20 are exposed on the side, facing away from the transparent rigid base 102, of the chip body 203. Therefore, the driving wire layer and the driving chip structure can be directly arranged on the side, facing away from the transparent rigid base 102, of the pins, so that the driving chip structure can be coupled to the pins of the plurality of light-emitting chips 20 through the driving wire layer 60, to provide driving signals for the plurality of light-emitting chips 20.

In the array substrate manufactured by the manufacturing method provided by the embodiment of the present disclosure, the transparent rigid base 102 is used, so that the formed array substrate is not prone to warpage during the manufacturing process and in actual application, thereby ensuring the process of assembling the array substrate to be implemented smoothly and a good light-emitting effect of the array substrate. Moreover, in the array substrate manufactured by the manufacturing method provided by the embodiment of the present disclosure, the light-emitting side of the chip body 203 of the light-emitting chip 20 faces towards the transparent rigid base 102, and the pins of the light-emitting chip 20 face away from the transparent rigid base 102, so that the driving wire layer 60 and the driving chip structure can be directly arranged on the side where the pins of the light-emitting chip 20 are located, so as to provide driving signals for the light-emitting chips 20, which not only avoids a process of perforate the base in the substrate and the side-edge traces do not need to be formed, which is more conducive to realization of the narrow frame design of the array substrate, and when the array substrates are spliced to form a large-size display device, a splicing gap between array substrates is narrow, which ensures the display quality of the display device formed by splicing.

In some embodiments, the step of arranging a plurality of light-emitting chips 20 on the transparent rigid base 102 specifically includes: forming a liquid or semi-solid colloidal material mixed with light-diffusing particles 90; using the colloidal material to form a first transparent colloid layer 71 on the transparent rigid base 102; attaching the plurality of light-emitting chips 20 on the side, facing away from the transparent rigid base 102, of the first light-transmitting colloid layer 71.

Specifically, a liquid or semi-solid colloidal material mixed with light-diffusing particles 90 may be formed first, and then the colloidal material may be used to form the first light-transmitting colloidal layer 71 on the transparent rigid base 102, and then the plurality of light-emitting chips 20 are attached to the side, facing away from the transparent rigid base 102, of the first light-transmitting colloidal layer 71, and finally the first light-transmitting colloidal layer 71 on which the light-emitting chips 20 are attached is cured, so as to fix the light-emitting chips 20 on the first light-transmitting colloidal layer 71.

It is worth noting that a specific type of the light-diffusing particles 90 can be selected according to actual needs, under a premise that the light-diffusing particles 90 can realize a light-diffusing function. For example, organic silicon light-diffusing particles are used, but the present disclosure is not limited to this.

In the manufacturing method provided by the foregoing embodiment, the first light-transmitting colloidal layer 71 is formed between the transparent rigid base 102 and the light-emitting chips 20, which not only enables the light-emitting chips 20 to be firmly fixed on the transparent rigid base 102 through the first light-transmitting colloidal layer 71, but also enables light emitted by the light-emitting chips 20 to pass through the first light-transmitting colloidal layer 71 and the transparent rigid base 102 to exit the array substrate, thereby ensuring good light-emitting performance of the array substrate.

Moreover, in the manufacturing method provided by the foregoing embodiment, the light-diffusing particles are provided in the first light-transmitting colloidal layer 71, so that when light passes through the first light-transmitting colloidal layer 71, the light-diffusing particles 90 can change the original transmission direction of the light, thereby enhancing diffusion of the light emitted from the transparent rigid base 102, and when the array substrate is used as a direct type backlight module in a display device, an optical distance (Optical Distance, OD for short) is reduced effectively, which is more conducive to a thinner size of the display device.

The manufacturing method provided in the foregoing embodiment further includes: forming a first protective layer 73 after the plurality of light-emitting chips 20 are arranged. The first protective layer 73 includes a first portion filled between chip bodies 203 and a second portion on a surface, facing away from the transparent rigid base 102, of the chip bodies 23. The second portion is provided with a plurality of openings, and the pins are located in the openings in a one-to-one correspondence, and the second portion is used to flatten the side, facing away from the transparent rigid base 102, of the chip bodies 203.

Specifically, after the plurality of light-emitting chips 20 are fixed on the transparent rigid base, the first protective layer 73 may be formed on the side, where the light-emitting chips 20 are arranged, of the transparent rigid base 102. The protective layer 73 at least includes the first portion filled between the chip bodies 203, so that the first protective layer 73 can surround the chip body 203 of each light-emitting chip 20, and effectively protection the chip body 203 of each light-emitting chip 20, thereby more beneficial to increase a service life of the light-emitting chip 20.

In addition to the first portion, the first protective layer 73 may also include the second portion on the surface, facing away from the transparent rigid base 102, of each chip body 203. The second portion is provided with a plurality of openings corresponding to the pins of the light-transmitting chips 20 in a one-to-one correspondence, and the pins of each light-emitting chip 20 are located in a corresponding opening in a one-to-one correspondence.

It is worth noting that the specific materials of the above-mentioned first protective layer 73 are various. For example, the first protective layer 73 is made of a colloidal material, so that not only the first protective layer 73 can be bonded to the light-emitting chips 20, side walls of the chip body 203 in each light-emitting chip 20 can also be bonded to the first light-transmitting colloidal layer through the first protective layer 73, which enhances firmness of the light-emitting chip 20 and is beneficial to improve reliability of the array substrate.

In the manufacturing method provided by the foregoing embodiment, after the plurality of light-emitting chips 20 are arranged, the first protective layer 73 is formed so that the first protective layer 73 can protect sidewalls of the chip bodies 23 of the light-transmitting chips 20, and protect the surface, facing away from the transparent rigid base 102, of the chip bodies 203, so as to better improve the reliability of the light-emitting chips 20 in practical applications. Moreover, by providing the second portion of the first protective layer 73, the second portion can flatten the side, facing away from the transparent rigid base 102, of each chip body 203, and when the driving wire layer 60 is used, the driving wire layer 60 can be directly formed on the surface, facing away from the transparent rigid base 102, of the second portion. In this way, not only production of the driving wire layer 60 is facilitated, but also coupling between conductive connection wires in the driving wire layer 60 and the pins of the light-emitting chip 20 may be easily achieved.

In some embodiments, the manufacturing method further includes: forming a second light-transmitting colloidal layer 72 on the side, facing away from the plurality of light-emitting chips 20, of the transparent rigid base 102 using a colloidal material.

Specifically, a liquid or semi-solid colloidal material mixed with light-diffusing particles 90 may be formed first, and then the colloidal material may be used to fabricate the second light-transmitting colloidal layer 72 on the side, facing away from the plurality of light-emitting chips 20, of the transparent rigid base 102. When the array substrate manufactured by the above-mentioned manufacturing method is used as a backlight module in the display device, the array substrate can be fixedly bonded to the display panel of the display device through the second light-transmitting colloidal layer 72.

Since the second light-transmitting colloidal layer 72 has good light-transmitting properties, and the second light-transmitting colloidal layer 72 includes light-diffusing particles 90, the light-diffusing particles 90 can change the original transmission direction of light when the light passes through the second light-transmitting colloidal layer 72, thereby further improving diffusion of the light emitted from the transparent rigid base 102, so that when the array substrate is used as a direct type backlight module in a display device, the OD value can be further reduced, which is more conducive to a thinner size of the display device.

In some embodiments, when each of the light-emitting chips 20 includes a first pin 201 and a second pin 202, the steps of manufacturing the driving wire layer 60 and binding the driving chip structure specifically include: manufacturing a first pad on a surface, facing away from the transparent rigid base 102, of the first pin 201; manufacturing a second pad on a surface, facing away from the transparent rigid base 102, of the second pin 202; manufacturing a plurality of first conductive connection wires on a side, facing away from the transparent rigid base 102, of the first pad, and manufacturing a plurality of second conductive connection wires on a side, facing away from the transparent rigid base 102, of the second pad; bonding the driving chip structure to a side, facing away from the transparent rigid base 102, of the first conductive connection wires and to a side, facing away from the transparent rigid base 102, of the second conductive connection wires, and coupling at least part of first pads with the plurality of first conductive connection wires together, and coupling the first pads with the driving chip structure, and coupling the second pads to the driving chip structure by the plurality of second conductive connection wires, respectively; forming a second protective layer 74 on a side, facing away from the transparent rigid base 102, of the driving chip structure.

Specifically, tin can be plated on the surface, facing away from the transparent rigid base 102, of the first pin 201 to form the first pad, and on a surface, facing away from the transparent rigid base 102, of the second pin 202 to form the second pad. Then, a plurality of first conductive connection wires and a plurality of second conductive connection wires are manufactured on a side, facing away from the transparent rigid base 102, of the first pad and on a side, facing away from the transparent rigid base 102, of the second pad, using a copper-depositing or silver-plating process, or using other conductive materials; and a driving chip 40 is bound to one side, facing away from the transparent rigid base 102, of the conductive connection wires, so that the plurality of first conductive connection wires couple at least part of the first pads together and couple the at least part of the first pads to the driving chip structure; the plurality of second conductive connection wires couple the second pads with the driving chip structure, respectively; after the driving chip 40 is bound, the second protective layer 74 may be further manufactured on a side, facing away from the transparent rigid base 102, of the second protective layer 74.

In the manufacturing method provided by the above-mentioned embodiment, the first pad is provided on the side, facing away from the transparent rigid base 102, of the first pin 201, and the second pad is provided on the side, facing away from the transparent rigid base 102, of the second pin 202, so that the first pin 201 can be coupled to the corresponding first conductive connection wire through the first pad, and the second pin 202 can be coupled to the corresponding second conductive connection wire through the second pad, thereby enhancing performance of the coupling between the pins and the conductive connection wires.

In addition, in the manufacturing method provided by the foregoing embodiment, the driving wire layer 60 is formed on the side, facing away from the transparent rigid base 102, of the chip body 203 of the light-emitting chip 20; and the driving chip structure is formed on the side, facing away from the transparent rigid base 102, of the driving wire layer 60. The driving wire layer 60 includes the first conductive connection wires and the second conductive connection wires, so that the driving chip structure can directly drive each of the light-emitting chips 20 individually through the first conductive connection wire and the second conductive connection wire, which not only avoids a process of perforating the base in the array substrate, but also does not need to form the side-edge trace. Therefore, it is more conducive to implement a narrow frame design of the array substrate, and when the array substrates are spliced to form a large-size display device, the splicing gaps between the array substrates are relatively narrow, which ensures the display quality of the display device formed by the splicing.

In addition, in the manufacturing method provided by the foregoing embodiment, after arranging the driving chip structure on the side, facing away from the transparent rigid base 102, of the driving wire layer 60, the protective layer may further be manufactured on the side, facing away from the transparent rigid base 102, of the driving chip structure. The second protective layer 74 covers the driving chip structure and a portion, not covered by the driving chip structure, of the driving wire layer 60, so as to realize protection of the driving chip structure and the driving wire layer 60.

It should be noted that the various embodiments in this specification are described in a progressive manner, and the same or similar parts between the various embodiments can be referred to each other, and each embodiment focuses on the differences from other embodiments. In particular, for the method embodiment, since the method embodiment is basically similar to the product embodiment, the description of the method embodiment is relatively simple, and relevant parts between the method embodiment and the product embodiment can be referred to the description of the product embodiment.

Unless otherwise defined, technical terms or scientific terms used in the present disclosure shall have common meanings understood by those of ordinary skills in the art to which the present disclosure belongs. Such words as "first", "second" and similar words used in the present disclosure do not indicate any order, quantity, or importance, but are only used to distinguish different components. Such words as "include" or "comprise" and other similar words mean that an element or item appearing before the word encompasses an element or item listed after the word and equivalents thereof, but does not exclude inclusion of other elements or items. Similar words such as "connected", "coupled" or "linked" are not limited to physical or mechanical connections, but may include electrical connections, whether direct or indirect connections. Such words as "up", "down", "left", "right", etc. are only used to indicate a relative position relationship, and when an absolute position of the described object changes, the relative position relationship may also change accordingly.

It can be understood that when an element such as a layer, film, region, or substrate is referred to as being "on" or "under" another element, the element can be "directly on" or "directly under" the another element, or there may be intermediate elements.

In description of the foregoing embodiments, specific features, structures, materials, or characteristics may be combined in any one or more embodiments or examples in an appropriate manner.

The above are only specific implementations of the present disclosure, but the protection scope of the present disclosure is not limited thereto. Any person skilled in the art can easily think of changes or substitutions within technical scopes disclosed in the present disclosure. Such changes or substitutions should be encompassed within the protection scope of the present disclosure. Therefore, the protection scope of the present disclosure should be determined in accordance with the protection scope of the claims.

What is claimed is:

1. An array substrate, comprising:
a transparent rigid base;
a plurality of light-emitting chips on the transparent rigid base, wherein each of the plurality of light-emitting chips comprises a chip body and a pin coupled to the chip body, and a light-emitting surface of the chip body faces towards the transparent rigid base, the pin is on a side, facing away from the transparent rigid base, of the chip body;
a driving wire layer on a side, facing away from the transparent rigid base, of the pin; and
a driving chip structure on a side, facing away from the transparent rigid base, of the driving wire layer, wherein the drive chip structure is coupled to pins of the plurality of light-emitting chips through the driving wire layer and is used to provide a driving signal for the plurality of light-emitting chips;
wherein the array substrate further comprises:
a first light-transmitting colloidal layer between the transparent rigid base and the plurality of light-emitting chips, wherein the chip body comprised in each of the plurality of light-emitting chips is bonded to the transparent rigid base through the first light-transmitting colloidal layer;
wherein the first light-transmitting colloidal layer comprises a light-diffusing particle, and the light-diffusing particle changes an original transmission direction of a light;

wherein each of the plurality of light-emitting chips comprises a first pin and a second pin; the driving wire layer comprises a plurality of first conductive connection wires and a plurality of second conductive connection wires, the plurality of first conductive connection wires is used to couple first pins of all of the plurality of light-emitting chips together, and couple the first pins to the driving chip structure; the plurality of second conductive connection wires is used to couple second pins of the plurality of light-emitting chips to the driving chip structure.

2. The array substrate according to claim 1, wherein the array substrate further comprises:
a second light-transmitting colloidal layer on a side, facing away from the plurality of light-emitting chips, of the transparent rigid base, wherein the second light-transmitting colloidal layer comprises a light-diffusing particle.

3. The array substrate according to claim 1, wherein the array substrate further comprises:
a first protective layer, at least comprising a first portion filled between chip bodies.

4. The array substrate according to claim 3, wherein the first protective layer further comprises:
a second portion, on a surface, facing away from the transparent rigid base, of the chip bodies, wherein the second portion is provided with a plurality of openings, and each pin is located in a corresponding one of the plurality of opening in a one-to-one correspondence, the second portion is used to flatten a side, facing away from the transparent rigid base, of the chip bodies.

5. The array substrate according to claim 3, wherein the first protective layer comprises a light-shielding colloidal layer or a light-transmitting colloidal layer.

6. The array substrate according to claim 1, wherein the plurality of first conductive connection wires and the plurality of second conductive connection wires are arranged in a same layer.

7. The array substrate according to claim 1, wherein the plurality of first conductive connection wires and the plurality of second conductive connection wires are distributed in different conductive layers, and an insulating layer is provided between adjacent conductive layers.

8. The array substrate according to claim 1, wherein,
a first pad is provided on a side, facing away from the transparent rigid base, of the first pin, and the first pin is coupled to a corresponding first conductive connection wire through the first pad;
a second pad is provided on a side, facing away from the transparent rigid base, of the second pin, and the second pin is coupled to a corresponding second conductive connection wire through the second pad.

9. The array substrate according to claim 1, wherein the array substrate is divided into at least two light-emitting areas, and each of the at least two light-emitting areas comprises multiple of the plurality of light-emitting chips;
the driving chip structure comprises at least two driving chips corresponding to the at least two light-emitting areas in a one-to-one correspondence, and the plurality of first conductive connection wires is used to couple first pins comprised in a same light-emitting area together, and the first pins are coupled to a corresponding driving chip of the at least two driving chips, the plurality of second conductive connection wires is used to couple second pins included in a same light-emitting area with a corresponding driving chip of the at least two driving chips.

10. The array substrate according to claim 1, wherein the array substrate further comprises:
a power supply motherboard, coupled to the driving chip structure through a flexible circuit board, and used to provide a control signal for the driving chip structure.

11. The array substrate according to claim 1, wherein the array substrate further comprises a second protective layer on a side, facing away from the transparent rigid base, of the driving chip structure.

12. A display device, comprising:
an array substrate, wherein the array substrate comprises:
a transparent rigid base;
a plurality of light-emitting chips on the transparent rigid base, wherein each of the plurality of light-emitting chips comprises a chip body and a pin coupled to the chip body, and a light-emitting surface of the chip body faces towards the transparent rigid base, the pin is on a side, facing away from the transparent rigid base, of the chip body;
a driving wire layer on a side, facing away from the transparent rigid base, of the pin; and
a driving chip structure on a side, facing away from the transparent rigid base, of the driving wire layer, wherein the drive chip structure is coupled to pins of the plurality of light-emitting chips through the driving wire layer and is used to provide a driving signal for the plurality of light-emitting chips;
wherein the array substrate further comprises:
a first light-transmitting colloidal layer between the transparent rigid base and the plurality of light-emitting chips, wherein the chip body comprised in each of the plurality of light-emitting chips is bonded to the transparent rigid base through the first light-transmitting colloidal layer;
wherein the first light-transmitting colloidal layer comprises a light-diffusing particle, and the light-diffusing particle changes an original transmission direction of a light;
wherein each of the plurality of light-emitting chips comprises a first pin and a second pin; the driving wire layer comprises a plurality of first conductive connection wires and a plurality of second conductive connection wires, the plurality of first conductive connection wires is used to couple first pins of all of the plurality of light-emitting chips together, and couple the first pins to the driving chip structure; the plurality of second conductive connection wires is used to couple second pins of the plurality of light-emitting chips to the driving chip structure.

13. The display device according to claim 12, wherein the display device further comprises a display panel on a light-exiting side of the array substrate, the display panel comprises a driving circuit board, a counter substrate arranged opposite to the driving circuit board, and a liquid crystal layer between the driving circuit board and the counter substrate, and the driving circuit board is between the array substrate and the counter substrate.

14. A method of manufacturing an array substrate, wherein the array substrate comprises: a transparent rigid base; a plurality of light-emitting chips on the transparent rigid base, wherein each of the plurality of light-emitting chips comprises a chip body and a pin coupled to the chip body, and a light-emitting surface of the chip body faces towards the transparent rigid base, the pin is on a side, facing away from the transparent rigid base, of the chip body; a driving wire layer on a side, facing away from the transparent rigid base, of the pin; and a driving chip structure on a side, facing away from the transparent rigid base, of the driving wire layer, wherein the drive chip structure is coupled to pins of the plurality of light-emitting chips through the driving wire layer and is used to provide a driving signal for the plurality of light-emitting chips, wherein the array substrate further comprises:
a first light-transmitting colloidal layer between the transparent rigid base and the plurality of light-emitting chips, wherein the chip body comprised in each of the plurality of light-emitting chips is bonded to the transparent rigid base through the first light-transmitting colloidal layer;
wherein the first light-transmitting colloidal layer comprises a light-diffusing particle, and the light-diffusing particle changes an original transmission direction of a light;
wherein each of the plurality of light-emitting chips comprises a first pin and a second pin;
the driving wire layer comprises a plurality of first conductive connection wires and a plurality of second conductive connection wires, the plurality of first conductive connection wires is used to couple first pins of all of the plurality of light-emitting chips together, and couple the first pins to the driving chip structure; the plurality of second conductive connection wires is used to couple second pins of the plurality of light-emitting chips to the driving chip structure;

the method further comprises:
providing the transparent rigid base;
arranging the plurality of light-emitting chips on the transparent rigid base, wherein each of the plurality of light-emitting chips comprises the chip body and the pin coupled to the chip body, and the light-emitting surface of the chip body faces towards the transparent rigid base, the pin is on a side, facing away from the transparent rigid base, of the chip body;
manufacturing the driving wire layer on a side, facing away from the transparent rigid base, of the pin;
binding the driving chip structure on a side, facing away from the transparent rigid base, of the driving wire layer, wherein the driving chip structure is coupled to pins of the plurality of light-emitting chips through the driving wire layer and is used for providing a driving signal for the plurality of light-emitting chips.

15. The method of manufacturing the array substrate according to claim 14, wherein arranging the plurality of light-emitting chips on the transparent rigid base specifically comprises:
forming a liquid or semi-solid colloidal material mixed with light-diffusing particles;
forming a first transparent colloidal layer on the transparent rigid base using the colloidal material;
attaching the plurality of light-emitting chips on a side, facing away from the transparent rigid base, of the first light-transmitting colloidal layer;
the manufacturing method further comprises:
forming a first protective layer after arranging the plurality of light-emitting chips, wherein the first protective layer comprises a first portion filled between chip bodies and a second portion on a surface, facing away from the transparent rigid base, of the chip bodies, the second portion is provided with a plurality of openings, each pin is located in a corresponding one of the plurality of opening in a one-to-one correspondence, the second portion is used to flatten a side, facing away from the transparent rigid base, of the chip bodies.

16. The method of manufacturing the array substrate according to claim 15, wherein the manufacturing method further comprises:
forming a second light-transmitting colloidal layer on a side, facing away from the plurality of light-emitting chips, of the transparent rigid base using the colloidal material.

17. The method of manufacturing the array substrate according to claim 14, wherein when each of the light-emitting chips comprises a first pin and a second pin, manufacturing the driving wire layer and binding the driving chip structure specifically comprises:
manufacturing a first pad on a surface, facing away from the transparent rigid base, of the first pin;
manufacturing a second pad on a surface, facing away from the transparent rigid base, of the second pin;
manufacturing a plurality of first conductive connection wires on a side, facing away from the transparent rigid base, of the first pad, and manufacturing a plurality of second conductive wires on a side, facing away from the transparent rigid base, of the second pad;
binding the driving chip structure on a side, facing away from the transparent rigid base, of the first conductive connection wires, and on a side, facing away from the transparent rigid base, of the second conductive connection wires, wherein the plurality of the first conductive connection wires couple at least part of first pads together, and couple the first pads to the driving chip structure; the plurality of second conductive connection wires couple second pads to the driving chip structure;
manufacturing a second protective layer on a side, facing away from the transparent rigid base, of the driving chip structure.

\* \* \* \* \*